(12) United States Patent
Shimizu

(10) Patent No.: US 11,397,249 B2
(45) Date of Patent: Jul. 26, 2022

(54) LIGHT DETECTION DEVICE AND ELECTRONIC APPARATUS COMPRISING A REVERSE BIAS VOLTAGE ADJUSTMENT IN ACCORDANCE WITH A PULSE NUMBER OUTPUT BY A FIRST SPAD ARRAY

(71) Applicant: SHARP KABUSHIKI KAISHA, Sakai (JP)

(72) Inventor: Takayuki Shimizu, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 910 days.

(21) Appl. No.: 16/305,870

(22) PCT Filed: May 31, 2017

(86) PCT No.: PCT/JP2017/020338
§ 371 (c)(1),
(2) Date: Nov. 29, 2018

(87) PCT Pub. No.: WO2017/209206
PCT Pub. Date: Dec. 7, 2017

(65) Prior Publication Data
US 2019/0259902 A1    Aug. 22, 2019

(30) Foreign Application Priority Data
Jun. 1, 2016    (JP) .............................. JP2016-110210

(51) Int. Cl.
| | | |
|---|---|---|
| G01S 17/10 | (2020.01) |
| G01S 7/484 | (2006.01) |
| G03B 13/20 | (2021.01) |
| G03B 13/36 | (2021.01) |
| H01L 27/144 | (2006.01) |
| H01L 31/02 | (2006.01) |
| H01L 31/107 | (2006.01) |
| H01L 31/12 | (2006.01) |
| G01S 7/4863 | (2020.01) |
| G01S 17/88 | (2006.01) |
| H01L 27/146 | (2006.01) |

(52) U.S. Cl.
CPC ............ *G01S 7/484* (2013.01); *G01S 7/4863* (2013.01); *G01S 17/10* (2013.01); *G01S 17/88* (2013.01); *G03B 13/20* (2013.01); *G03B 13/36* (2013.01); *H01L 27/146* (2013.01); *H01L 27/1446* (2013.01); *H01L 31/02027* (2013.01); *H01L 31/107* (2013.01); *H01L 31/12* (2013.01)

(58) Field of Classification Search
CPC .......... G01S 17/02; G01S 17/04; G01S 17/06; G01S 17/10; G01S 17/66; G01S 17/88; G01S 7/486; G03B 13/20; G03B 13/36; H01L 31/0202; H01L 31/107
USPC .................................. 250/214 R, 214.1, 221
See application file for complete search history.

(56) References Cited

U.S. PATENT DOCUMENTS 10,012,534 B2    7/2018    Andreou .................. G01J 1/44
2016/0084964 A1    3/2016    Kimura et al.

FOREIGN PATENT DOCUMENTS

| GB | 2510891 A | 8/2014 |
| JP | 2013-016638 A | 1/2013 |
| JP | 2016-061729 A | 4/2016 |

*Primary Examiner* — Que Tan Le
(74) *Attorney, Agent, or Firm* — ScienBiziP, P.C.

(57) ABSTRACT

A light detection devices includes a SPAD bias control block that adjusts a reverse bias voltage in accordance with a pulse number of a pulse signal which is output by a SPAD array upon incidence of first light.

6 Claims, 8 Drawing Sheets

| 1: LIGHT DETECTION DEVICE | 8, 9: SPAD ARRAY |
| 3: VCSEL | 30, 31: OPTICAL FILTER |
| 4, 5: FIRST LIGHT | 32: LIGHT-SHIELDING WALL |
| 7: SECOND LIGHT | 33: MIRROR |

VHV_v: VOLTAGE VALUE OF POWER SOURCE VHV
$V_{BD}$: BREAKDOWN VOLTAGE
Vex: OVERVOLTAGE

1': LIGHT DETECTION DEVICE
3: VCSEL
4, 5: FIRST LIGHT
7: SECOND LIGHT
8, 9: SPAD ARRAY
30, 31: OPTICAL FILTER
32: LIGHT-SHIELDING WALL

LIGHT DETECTION DEVICE AND ELECTRONIC APPARATUS COMPRISING A REVERSE BIAS VOLTAGE ADJUSTMENT IN ACCORDANCE WITH A PULSE NUMBER OUTPUT BY A FIRST SPAD ARRAY

TECHNICAL FIELD

The present invention relates to a light detection device that uses an avalanche effect and an electronic apparatus.

BACKGROUND ART

In these years, portable information terminals such as a smartphone have been widely spread. In addition, in accordance with reduction in a size of a camera, a proximity sensor, an azimuth sensor, an acceleration sensor, an angular velocity sensor, an illuminance sensor, or the like, various sensors have been mounted on various portable information terminals. For automatic focus (AF) of a camera built in a smartphone, conventionally, a method of performing automatic focus of the camera by using contrast of an image has been generally used. However, the AF using contrast of an image has a disadvantage such that, when contrast of an object to be photographed is low due to a dark place or the like, an AF speed is extremely lowered and focusing of a lens becomes tardy. There is a demand for a small-sized and high-speed ranging sensor capable of high-speed speed AF even in a dark place, and an AF ranging sensor of a TOF (Time Of Flight) type has begun to be mounted on a portable information terminal in these years.

A small-sized and light ranging sensor is demanded also for a robot such as a drone. A ranging sensor of the TOF type which is advantageous to size reduction is useful compared with a ranging sensor using a PSD light-receiving element of a triangulation method.

It has been conventionally known that an avalanche photodiode operated in a Geiger mode is able to detect a single photon. FIG. 7 is a graph indicating an operation state in the Geiger mode in a conventional avalanche photodiode. As indicated in FIG. 7, the detection of a single photon is realized by reversely biasing the avalanche photodiode with a voltage greater than a breakdown voltage $V_{BD}$ (point A in FIG. 7). When a photon reaches and avalanche amplification is caused, the avalanche photodiode is brought into a meta-stable state (point B in FIG. 7). The avalanche amplification is quenched by a quenching resistor connected to the avalanche photodiode (point C in FIG. 7), and, at this time, a reverse bias voltage becomes smaller than the breakdown voltage $V_{BD}$. Thereafter, when the reverse bias voltage becomes great again, the avalanche photodiode is brought into a standby state in the Geiger mode and keeps the standby state (point A in FIG. 7) until a photon becomes incident next time. Note that, in FIG. 7, a voltage VHV_v is a voltage value of a power source by which the reverse bias voltage is applied, and Vex is an overvoltage (difference between the breakdown voltage $V_{BD}$ and the voltage value VHV_v).

Related to a method of applying a bias voltage to an SPAD (Single Photon Avalanche Diode), there is a following technique by which the SPAD is used in the Geiger mode. The SPAD is also called a single photon avalanche diode.

A photodiode array module disclosed in PTL 1 includes a plurality of avalanche photodiodes that operate in a Geiger mode, a high voltage generation unit, and a current detection unit. The high voltage generation unit generates a DC voltage applied to a photodiode array. The current detection unit detects a current flowing through the photodiode array and generates a current monitor signal. A control unit controls the high voltage generation unit so that the DC voltage to be generated is changed. Moreover, the control unit obtains an inflection point in a change of the current flowing through the photodiode array with respect to the change of the DC voltage applied to the photodiode array, on the basis of the current monitor signal generated in the current detection unit. Furthermore, the control unit decides a recommended operating voltage on the basis of the DC voltage at the inflection point.

It is thereby possible to provide the photodiode array module capable of easily and accurately deciding the recommended operating voltage of a reverse bias voltage to be applied to the photodiode array.

Moreover, a photon detection element disclosed in PTL 2 includes one or more avalanche photodiodes and a nonlinear circuit that is connected between cathodes of the one or more avalanche photodiodes and an external power source. In the nonlinear circuit, a second temperature coefficient representing variation of setting potential with respect to temperature variation when constant-current driving is performed so that electrical potential of the cathodes becomes equal to the setting potential is substantially the same as a first temperature coefficient representing variation of a breakdown voltage of the one or more avalanche photodiodes with respect to temperature variation.

It is thereby possible to easily compensate a temperature characteristic of a multiplication factor of the one or more avalanche photodiodes.

CITATION LIST

Patent Literature

PTL 1: Japanese Unexamined Patent Application Publication No. 2013-16638 (published on Jan. 24, 2013)
PTL 2: Japanese Unexamined Patent Application Publication No. 2016-61729 (published on Apr. 25, 2016)

SUMMARY OF INVENTION

Technical Problem

However, in the photodiode array module disclosed in PTL 1, there is a problem that the current detection unit, that is, a current detection circuit needs to be provided and a circuit scale becomes large. In addition, in the photon detection element disclosed in PTL 2, initial breakdown voltages of the respective avalanche photodiodes need to be individually stored in advance in order to cope with a case where the breakdown voltage varies. That is, for the photon detection element disclosed in PTL 2, in addition to an operation performed by the photon detection element, processing of causing the initial breakdown voltages of the avalanche photodiodes to be stored is required. Therefore, there is a problem that a man-hour for manufacturing the photon detection e rent increases and an increase in manufacturing costs is caused.

The invention is made in view of the aforementioned problems, and an object thereof is to provide a light detection device that has a reduced circuit scale and enables reduction of manufacturing costs, and an electronic apparatus.

Solution to Problem

In order to solve the aforementioned problems, a light detection device according to an aspect of the invention includes: a first SPAD array on which first light that is a light pulse emitted from a light emitting unit is incident and which operates in a Geiger mode; a second SPAD array on which second light that is obtained when the first light is reflected by a detection target is incident and which operates in the Geiger mode; a voltage generation unit that applies a reverse bias voltage to the first SPAD array and the second SPAD array; and a voltage adjustment unit that adjusts the reverse bias voltage in accordance with a pulse number of a pulse signal output by the first SPAD array upon incidence of the first light.

Advantageous Effects of Invention

According to an aspect of the invention, it is possible to provide a light detection device that has a reduced circuit scale and enables reduction of manufacturing costs, and an electronic apparatus.

DESCRIPTION OF EMBODIMENTS

Embodiment 1

Figure 1:
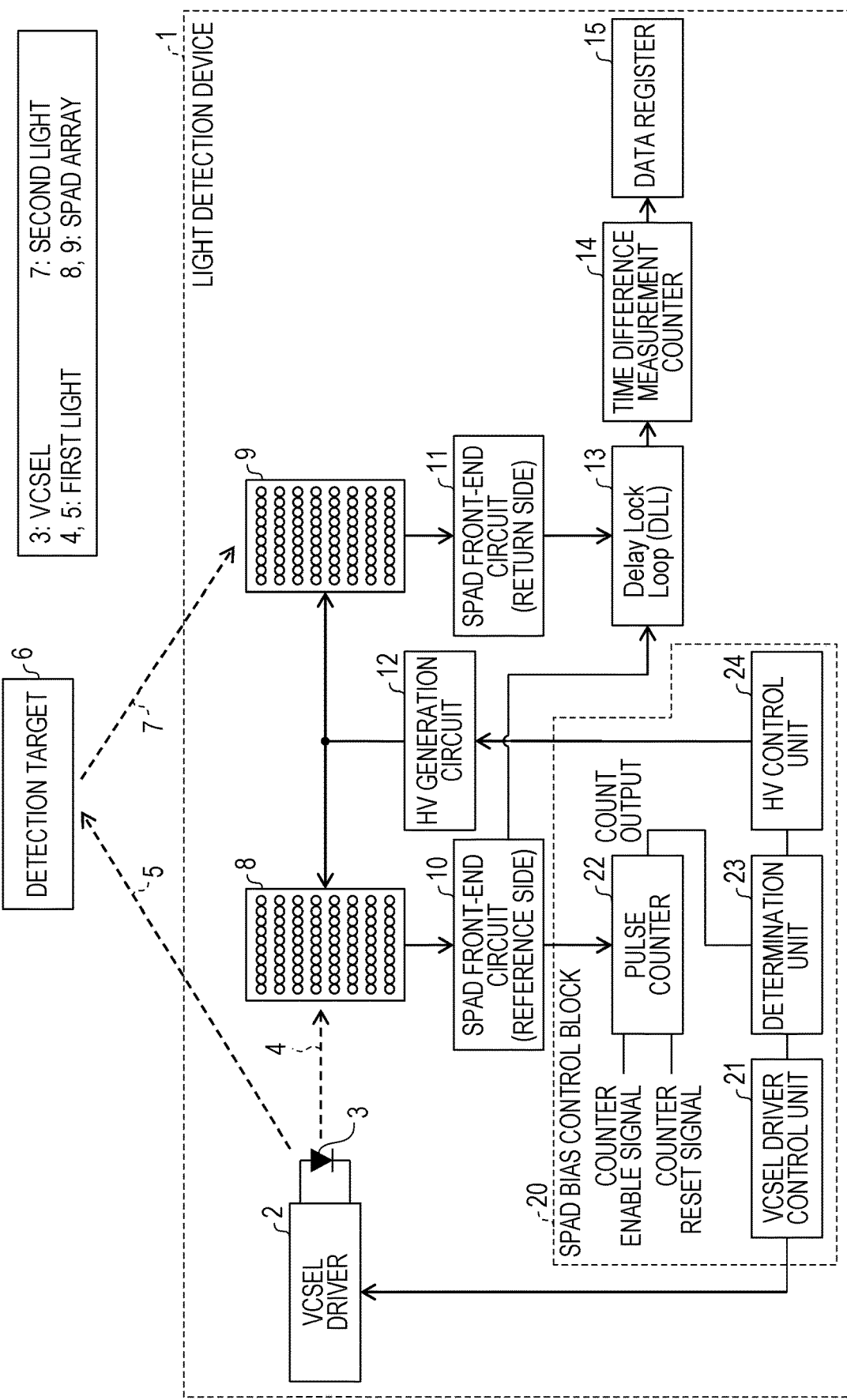
FIG. 1 is a block diagram illustrating a configuration of a light detection device according to Embodiment 1 of the invention.

Hereinafter, an embodiment of the invention will be described as below with reference to FIGS. 1 and 2. FIG. 1 is a block diagram illustrating a structure of a light detection device 1 according to Embodiment 1 of the invention.

As illustrated in FIG. 1, the light detection device 1 in the present embodiment includes a VCSEL driver 2, a VCSEL 3 (light emitting unit), a SPAD array 8 (first SPAD array) on a reference side, a SPAD array 9 (second SPAD array) on a return side, a SPAD front-end circuit 10 on the reference side, a SPAD front-end circuit 11 on the return side, an HV generation circuit 12 (voltage generation unit), a DLL 13, a time difference measurement counter 14, a data resister 15, and a SPAD bias control block 20 (voltage adjustment unit).

The light detection device 1 is a ranging sensor of a TOF type, which uses a SPAD and measures a distance to a detection target 6.

The VCSEL (Vertical Cavity Surface Emitting Laser) driver 2 drives the VCSEL 3. That is, on the basis of information received from the SPAD bias control block 20, the VCSEL driver 2 causes the VCSEL 3 to emit a light pulse.

The VCSEL 3 emits the light pulse to the SPAD array 8 and the detection target 6 when measuring a distance between the light detection device 1 and the detection target 6. At this time, the light pulse with which the VCSEL 3 irradiates the SPAD array 8 is set as first light 4, and the light pulse with which the VCSEL 3 irradiates the detection target 6 is set as first light 5. Moreover, light reflected by the detection target 6 when the detection target 6 is irradiated with the first light 5 is set as second light 7.

The SPAD array 8 and the SPAD array 9 each include a SPAD, and are connected to the SPAD front-end circuit 10 and the SPAD front-end circuit 11, respectively. The SPAD front-end circuit 10 and the SPAD front-end circuit 11 respectively perform waveform shaping of pulse signals received from the SPAD array 8 and the SPAD array 9.

The SPAD array 8 on the reference side directly receives the first light 4 emitted from the VCSEL 3 to thereby receive the first light 4 as a pulse signal. The SPAD array 8 transmits the pulse signal to the SPAD front-end circuit 10. The HV generation circuit 12 applies a reverse bias voltage to the SPAD array 8.

The SPAD array 9 receives the second light 7 obtained when the first light 5 is reflected by the detection target 6, and thereby receives the second light 7 as a pulse signal. The SPAD array 9 transmits the pulse signal to the SPAD front-end circuit 11. The HV generation circuit 12 applies a reverse bias voltage to the SPAD array 9.

The SPAD front-end circuit 10 on the reference side receives the pulse signal from the SPAD array 8. The SPAD front-end circuit 10 is connected to the SPAD bias control block 20 and the DLL 13. The SPAD front-end circuit 10 shapes a waveform of the pulse signal received from the SPAD array 8, and supplies the resultant to the DLL 13 and the SPAD bias control block 20.

Similarly, the SPAD front-end circuit 11 on the return side receives the pulse signal from the SPAD array 9. The SPAD front-end circuit 11 is connected to the DLL 13. The SPAD front-end circuit 11 shapes a waveform of the pulse signal received from the SPAD array 9, and supplies the resultant to the DLL 13.

The DLL (Delay Lock Loop) 13 is connected to the SPAD front-end circuits 10 and 11. The DLL 13 detects an average value of a time difference between the pulse signal supplied from the SPAD front-end circuit 11 and the pulse signal supplied from the SPAD front-end circuit 10. The time difference corresponds to a time of flight of light, which corresponds to the distance between the light detection device 1 and the detection target 6.

The time difference measurement counter 14 measures, by a counter, the average value of the time difference between the pulse signal on the return side and the pulse signal on the reference side which are detected by the DLL 13. Thereby, the light detection device 1 is able to calculate the distance from the light detection device 1 to the detection target 6. Note that, a method of calculating the distance from the detection device 1 to the detection target 6 on the basis of a measurement value of the time difference measurement counter 14 is able to be achieved by a known technique and different from the point of the invention, so that detailed description thereof will be omitted.

The data register 15 stores, as record, the distance from the light detection device 1 to the detection target 6, which is calculated by the time difference measurement counter 14.

The HV generation circuit 12 generates the reverse bias voltage to be applied to the SPAD array 8 and the SPAD array 9.

The SPAD bias control block 20 includes a VCSEL driver control unit 21, a pulse counter 22, a determination unit 23, and an HV control unit 24. The SPAD bias control block 20 adjusts an output voltage of the HV generation circuit 12 in accordance with presence or absence of the pulse signal output from the SPAD array 8 on the reference side.

The pulse counter 22 counts the pulse signal output from the SPAD array 8, when the reverse bias voltage to be applied to the SPAD array 8 and the SPAD array 9 is set.

The determination unit 23 determines a pulse number which is output by the pulse counter 22.

The VCSEL driver control unit 21 controls the HV control unit 24, which controls the HV generation circuit 12, and the VCSEL driver 2 in accordance with a determination result by the determination unit 23. Thereby, the VCSEL driver control unit 21 is able to control the VCSEL 3 and the HV generation circuit 12 in accordance with the determination result by the determination unit 23.

Accordingly, the SPAD bias control block 20 is able to cause the SPAD array 8 and the SPAD array 9 to operate in the optimum Geiger mode. Moreover, the SPAD bias control block 20 determines presence or absence of the pulse signal output from the SPAD on the reference side, even when the VCSEL 3 does not emit light. However, by limiting the determination of presence or absence of the pulse signal output from the SPAD on the reference side only to a period when the VCSEL 3 emits light, the SPAD bias control block 20 is able to cause a constant amount of light to be incident on the SPAD array on the reference side at all times. Thereby, the light detection device 1 is hardly affected by dark count, and is able to perform more accurate control with a reverse bias voltage. The dark count is occurrence frequency of noise (dark noise) due to a carrier of a dark current that thermally occurs.

Figure 2:
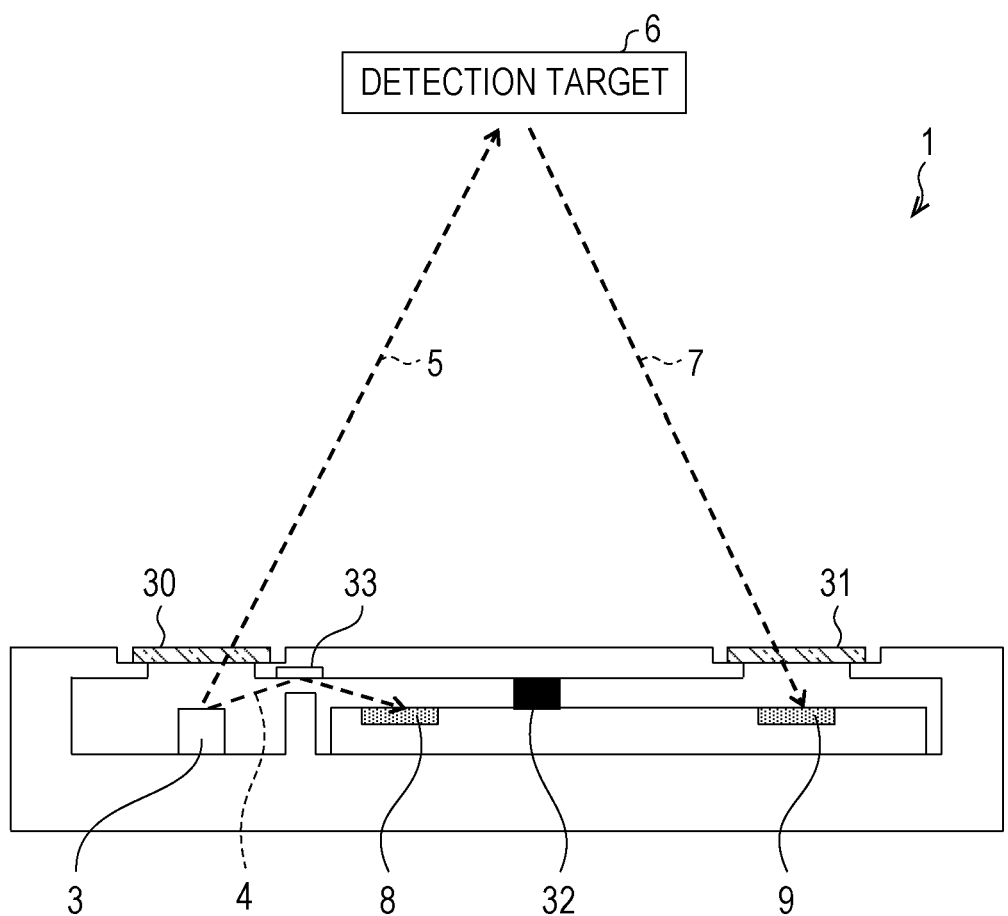
FIG. 2 is a sectional view illustrating a structure of the light detection device according to Embodiment 1 of the invention.

FIG. 2 is a sectional view illustrating the structure of the light detection device 1 according to Embodiment 1 of the invention. The light detection device 1 in the present embodiment includes optical filters 30 and 31, a light-shielding wall 32, and a mirror 33 as illustrated in FIG. 2.

The light detection device 1 has the structure in which only the first light 4 emitted by the VCSEL 2 is incident on the SPAD array 8 and only the second light 7 that is reflection light from the detection target 6 is incident on the SPAD array 9.

Specifically, the light-shielding wall 32 is arranged between the SPAD array 8 and the SPAD array 9. This achieves the structure such that the first light 4 emitted by the VCSEL 3 is not directly incident on the SPAD array 9. That is, the structure is such that only the second light 7 that is the reflection light from the detection target 6 is incident on the SPAD array 9.

The optical filters 30 and 31 are bandpass filters that cause a wavelength near an emission wavelength (an infrared ray is used and the wavelength is usually 850 nm or 940 nm) of the VCSEL 3 to pass therethrough, and have a configuration such that an erroneous response of the SPAD due to disturbance light hardly occurs.

To enhance detection efficiency, in the light detection device 1, the mirror 33 is arranged on a reflection surface of the first light 4 as illustrated in FIG. 2.

Figure 8:
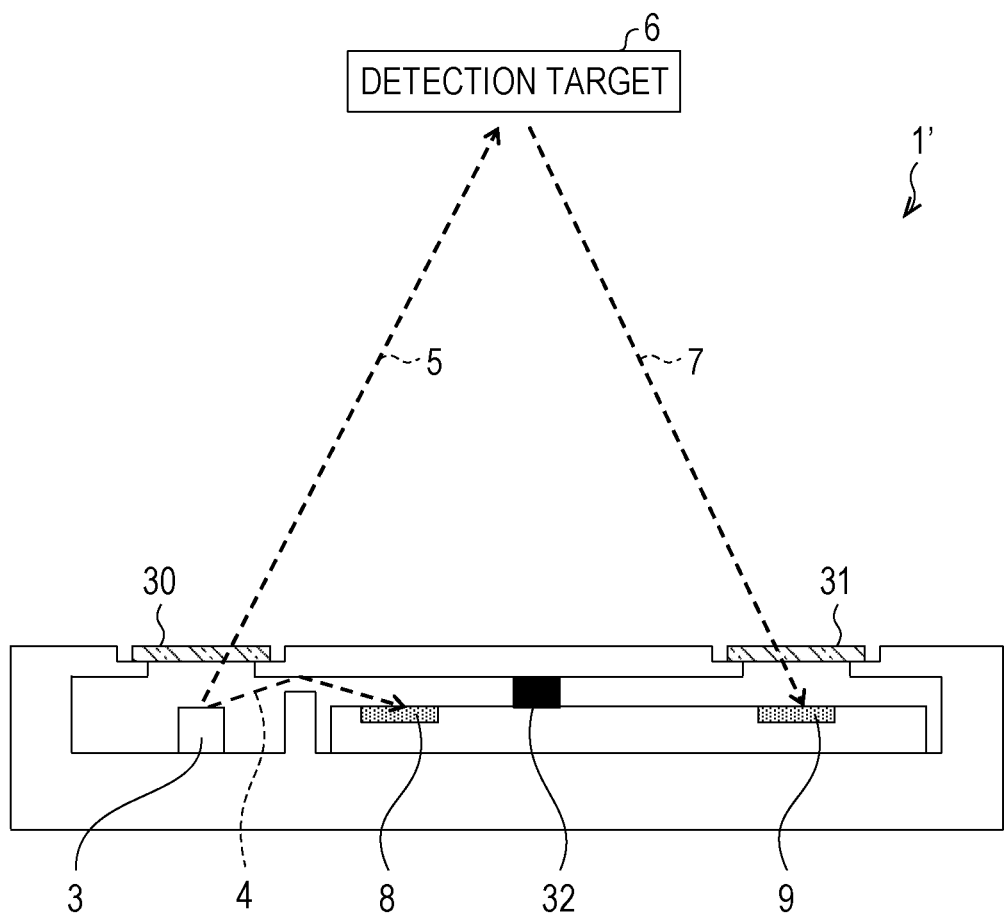
FIG. 8 is a sectional view illustrating a structure of another light detection device having a configuration in which a mirror is omitted from a configuration of the light detection device illustrated in FIG. 2.

FIG. 8 is a sectional view illustrating a structure of another light detection device 1' having a configuration in which the mirror 33 is omitted from the configuration of the light detection device 1 illustrated in FIG. 2. As illustrated in FIG. 8, the light detection device 1' has the configuration in which the mirror 33 is omitted from the configuration of the light detection device 1 illustrated in FIG. 2. As in the light detection device 1', the first light 4 emitted by the VCSEL 3 may be reflected by a wall of a package so that the first light 4 reaches the SPAD array 8. Since sensitivity of the SPAD is generally high, reflection by the wall of the package whose reflectance is low compared with that of the mirror 33 is enough to secure sensitivity with which the SPAD array 8 and the SPAD array 9 respond. Furthermore, the omission of the mirror 33 leads to reduction in costs.

Embodiment 2

Another embodiment of the invention will be described as follows with reference to FIGS. 3 and 4. Note that, for convenience of description, the same reference signs will be assigned to members having the same functions as those of the members described in the above-described embodiment, and description thereof will be omitted.

Configuration of SPAD Array and SPAD Front-End Circuit

Although description will be hereinafter given for the SPAD array 8 and the SPAD front-end circuit 10 as an example, the SPAD array 9 and the SPAD front-end circuit 11 also have a similar configuration.

Figure 3:
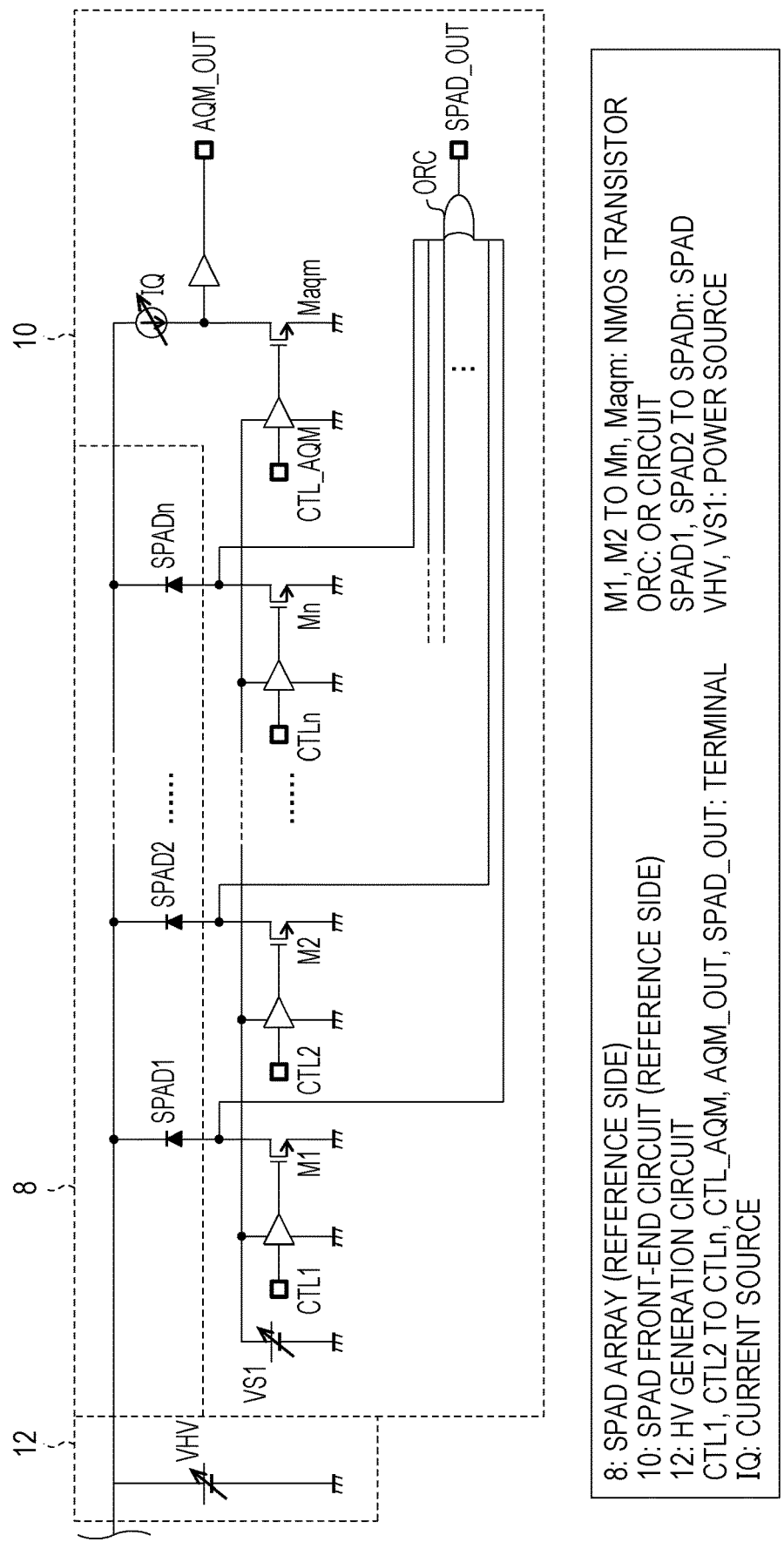
FIG. 3 is a circuit diagram illustrating a SPAD array, a SPAD front-end circuit, and an 8V generation circuit which are on a reference side according to Embodiment 2 of the invention.
Figure 4:
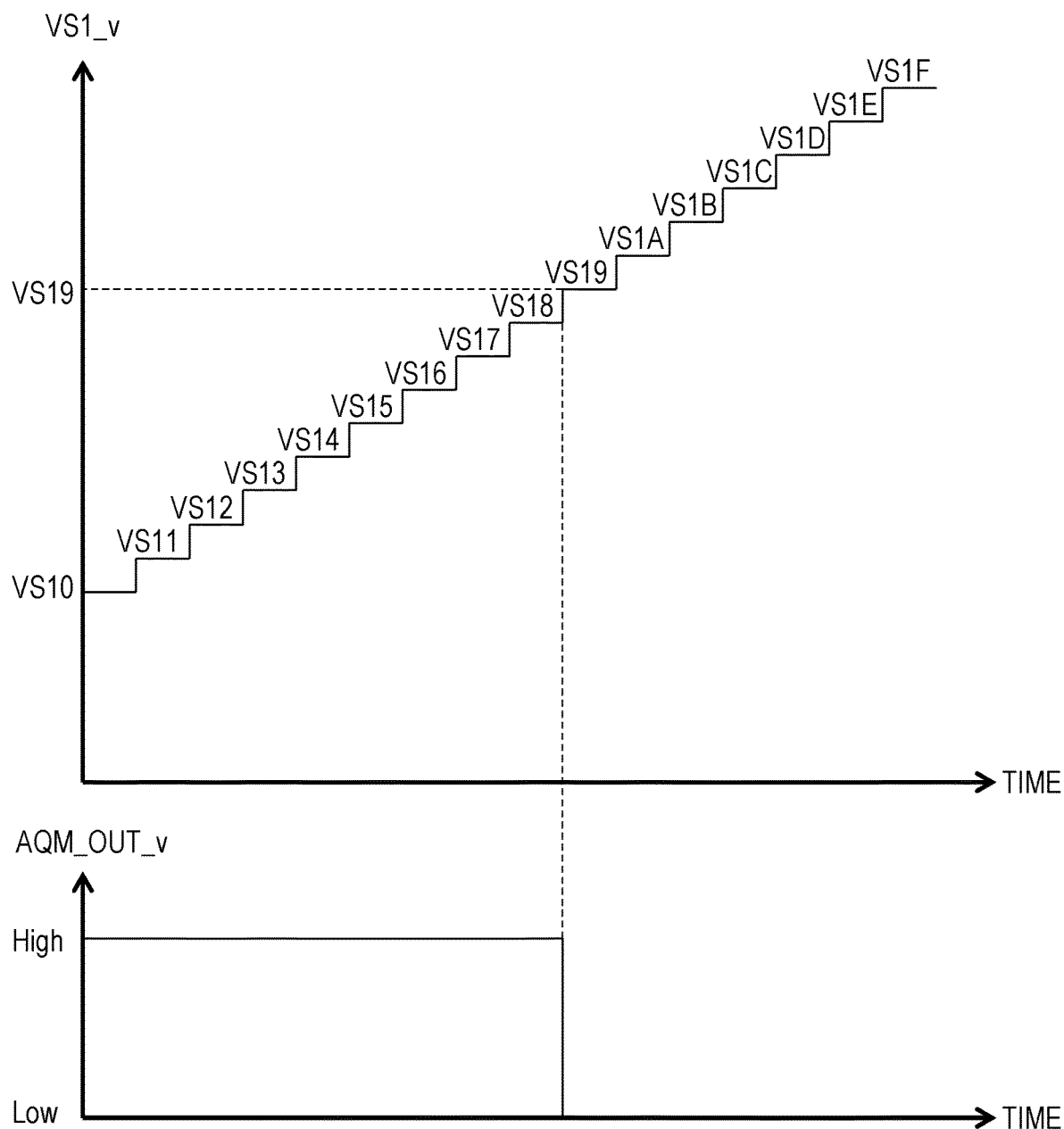
FIG. 4 is a graph indicating outputs of a power source and a terminal of an active-quenching circuit according to Embodiment 2 of the invention.

FIG. 3 is a circuit diagram illustrating the SPAD array 8, the SPAD front-end circuit 10, and the HV generation circuit 12 according to Embodiment 2 of the invention. As illustrated in FIG. 3, the SPAD array 8 is constituted by n SPADs SPAD1 to SPADn. All of cathodes of the SPAD SPAD1 to the SPAD SPADn are connected to a high-voltage power source VHV that applies a bias voltage and a current source IQ. Moreover, anodes of the SPAD SPAD1 to the SPAD SPADn are connected to an active-quenching circuit constituted by n NMOS transistors M1 to Mn that have the same size. Furthermore, the anodes of the SPAD SPAD1 to the SPAD SPADn are connected to an OR circuit CRC. The OR circuit ORC receives outputs from the SPAD SPAD1 to the SPAD SPADn, and outputs a result calculated from the outputs to a terminal SPAD_OUT.

The SPAD front-end circuit 10 includes the active-quenching circuit, the OR circuit ORC, and the terminal SPAD_OUT.

The active-quenching circuit includes the NMCS transistors M1 to Mn, the current source IQ, and a terminal AQM_OUT.

Drains of the NMCS transistors M1 to Mn that are configured in the active-quenching circuit are respectively connected to the SPADs SPAD1 to SPADn. Gates of the NMOS transistors M1 to Mn are respectively connected to terminals CTL1 to CTLn.

Operation of SPAD Front-End Circuit

An operation below is an operation applied to both of the SPAD front-end circuits 10 and 11.

A current waveform of a pulse signal output from each of the SPAD SPAD1 to the SPAD SPADn is converted into a voltage waveform by the active-quenching circuit. That is, the pulse signal output from each of the SPAD SPAD1 to the SPAD SPADn is converted from a current into a voltage. The pulse signal subjected to the voltage conversion is transmitted to the OR circuit ORC, and the pulse signal is output from the terminal SPAD_OUT. Thereby, in a case where a pulse signal is output from any one of the SPAD SPAD1 to the SPAD SPADn, an output signal is to be output from the terminal SPAD_OUT. It is therefore possible to enhance sensitivity of the light detection device 1 by using a large number of SPADs.

Method of Adjusting Resistance Value of Active-Quenching Circuit

A method of adjusting a resistance value of the active-quenching circuit will be described by using FIG. 4. FIG. 4 is a graph indicating outputs of the power source and the terminal of the active-quenching circuit according to Embodiment 2 of the invention.

In the active-quenching circuit, the current source IQ is arranged. The current source IQ is able to change a current value to any value. A configuration is such that, when a terminal CTL_AQM is at a High level, a gate voltage of an NMOS transistor Maqm becomes a voltage VS1_v of a power source VS1.

The resistance value of the active-quenching circuit is set is set by using a current value of the SPAD SPAD1 to the SPAD SPADn, which is output from the SPAD front-end circuit 10, as a current value IQ_v of the current source IQ. Moreover, by setting the terminal CTL_AQM to be at a High level, the voltage VS1_v of the power source VS1 is raised stepwisely as illustrated in FIG. 4.

When the voltage VS1_v of the power source VS1 is raised, the gate voltage of the NMOS transistor Maqm is raised. Thereby, a source-gate voltage of the NMOS transistor Maqm becomes great and ON resistance of the NMOS transistor Maqm becomes small. The voltage VS1_v of the power source VS1 may be raised at equal intervals or unequal intervals.

The voltage VS1_v (VS19 in FIG. 4) of the power source VS1 when the voltage VS1_v of the power source VS1 is raised and a level of a voltage AQM_OUT_v of the terminal AQM_OUT is reversed from a High level to a Low level is decided as a control voltage of the active-quenching circuit. In accordance with the control voltage decided at this time, the resistance value of quenching resistor of the active-quenching circuit is also decided.

After the resistance value of the quenching resistor of the active-quenching circuit is decided, a reverse bias voltage applied to each SPAD of the SPAD array 8 and the SPAD array 9 is adjusted, so that it is possible to perform more accurate control with a reverse bias voltage.

Embodiment 3

Another embodiment of the invention will be described as follows with reference to FIG. 5. Note that, for convenience of description, the same reference signs will be assigned to members having the same functions as those of the members described in the above-described embodiments, and description thereof will be omitted.

An operation of the light detection device 1 in the present embodiment will be described by using FIG. 5. FIG. 5 is a sequence diagram illustrating the operation of the light detection device 1 according to Embodiment 3 of the invention.

As to the light detection device 1 in the present embodiment, one ranging operation is roughly divided into three operation sequences. The three operations mean a pre-measurement setting period 40, a distance measurement period 41, and a distance measurement period 42.

The pre-measurement setting period 40 is divided into a quenching resistance value setting period 40A and a VHV voltage setting period 40B. The quenching resistance value setting period 40A is provided first, and the VHV voltage setting period 40B is provided later. The pre-measurement setting period 40 is a period during which a quenching resistance value and a VHV voltage are set before the distance to the detection target 6 is actually measured.

In the quenching resistance value setting period 40A, the resistance value of the active-quenching circuit, which has been described in Embodiment 2, is set. After the setting of the resistance value of the active-quenching circuit is finished, the VHV voltage setting period 40B comes next.

In the VHV voltage setting period 40B, the reverse bias voltage (voltage of the power source VHV) for the SPAD array 8 and the SPAD array 9 is set. It is thereby possible to cause the SPAD array 8 and the SPAD array 9 to operate in the optimum Geiger mode, before the distance between the light detection device 1 and the detection target 6 is measured. This makes it possible to perform more accurate control with the reverse bias voltage when the distance between the light detection device 1 and the detection target 6 is measured. After the setting of the reverse bias voltage is finished, the distance measurement period 41 comes next.

In the distance measurement period 41, the light detection device 1 causes the VCSEL 3 to emit light to start an operation related to measurement of the distance between the light detection device 1 and the detection target 6, and causes the DLL 13 to converge. After the measurement of the distance to the detection target 6 is finished, the distance measurement period 42 comes next.

In the distance measurement period 42, by counting a delay amount of the DLL 13 that has converged in the distance measurement period 41, the distance from the light detection device 1 to the detection target 6 is converted into data and stored in the data register 15.

In a case where the distance between the light detection device 1 and the detection target 6 is measured continuously, periods that pass in order of the pre-measurement setting period 40, the distance measurement period 41, the distance measurement period 42, and a pause period are set as one set of a sequence and the measurement is iterated. By always performing setting of the quenching resistance value and setting of the VHV voltage before measuring the distance, it is possible to perform accurate control with the reverse bias voltage of the SPAD array 8 and the SPAD array 9. The pause period is freely adjusted in accordance with frequency of the measurement of the distance between the light detection device 1 and the detection target 6. This prevents excessive load on the light detection device 1.

Figure 5:
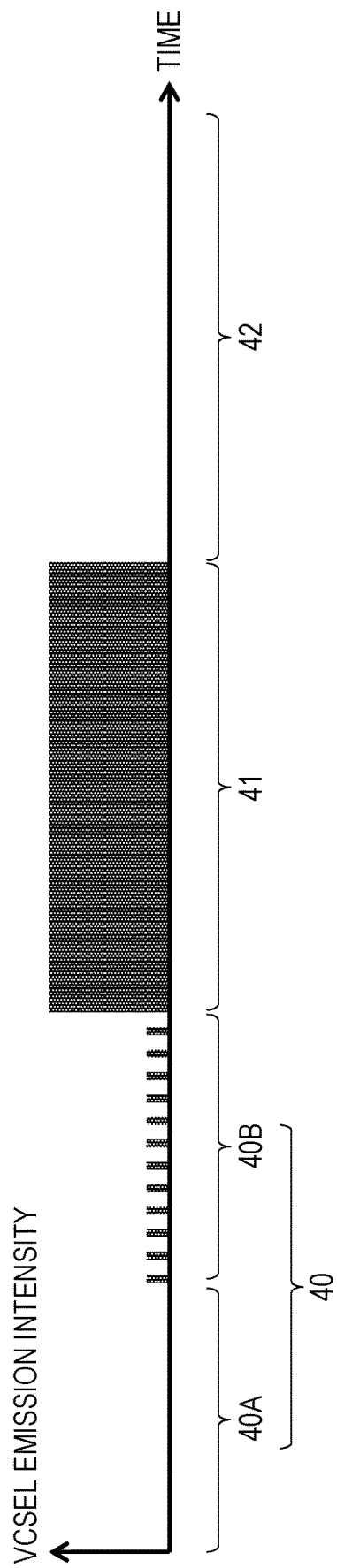
FIG. 5 is a sequence diagram illustrating an operation of a light detection device according to Embodiment 3 of the invention.

At this time, as illustrated in FIG. 5, a case where the SPAD bias control block 20 adjusts the voltage of the power source VHV by causing the VCSEL 3 to emit light in the pre-measurement setting period. 40 is considered. In this case, the VCSEL driver 2 causes the VCSEL 3 to emit light weaker than an emission amount of the VCSEL 3 at a time of measuring the distance during the distance measurement period 41. That is, as is clear from VCSEL emission intensity indicated as a vertical axis of the graph in FIG. 5, the following can be noted. Emission intensity of light emitted by the VCSEL 3 when the reverse bias voltage is adjusted (VHV voltage setting period 40B) is weaker than emission intensity of light emitted by the VCSEL 3 when the operation related to measurement of the distance between the light detection device 1 and the detection target 6 is started (distance measurement period 41).

Accordingly, when the SPAD bias control block 20 adjusts the voltage of the power source VHV, it is possible to easily suppress power consumption of the light detection device 1 by performing the adjustment with a smallest light amount required by the VCSEL 3. As described above in Embodiment 1, the VHV voltage is adjusted by counting a pulse number of the SPAD array 8 on which the first light 4 emitted by the VCSEL 3 is incident.

Embodiment 4

Figure 6:
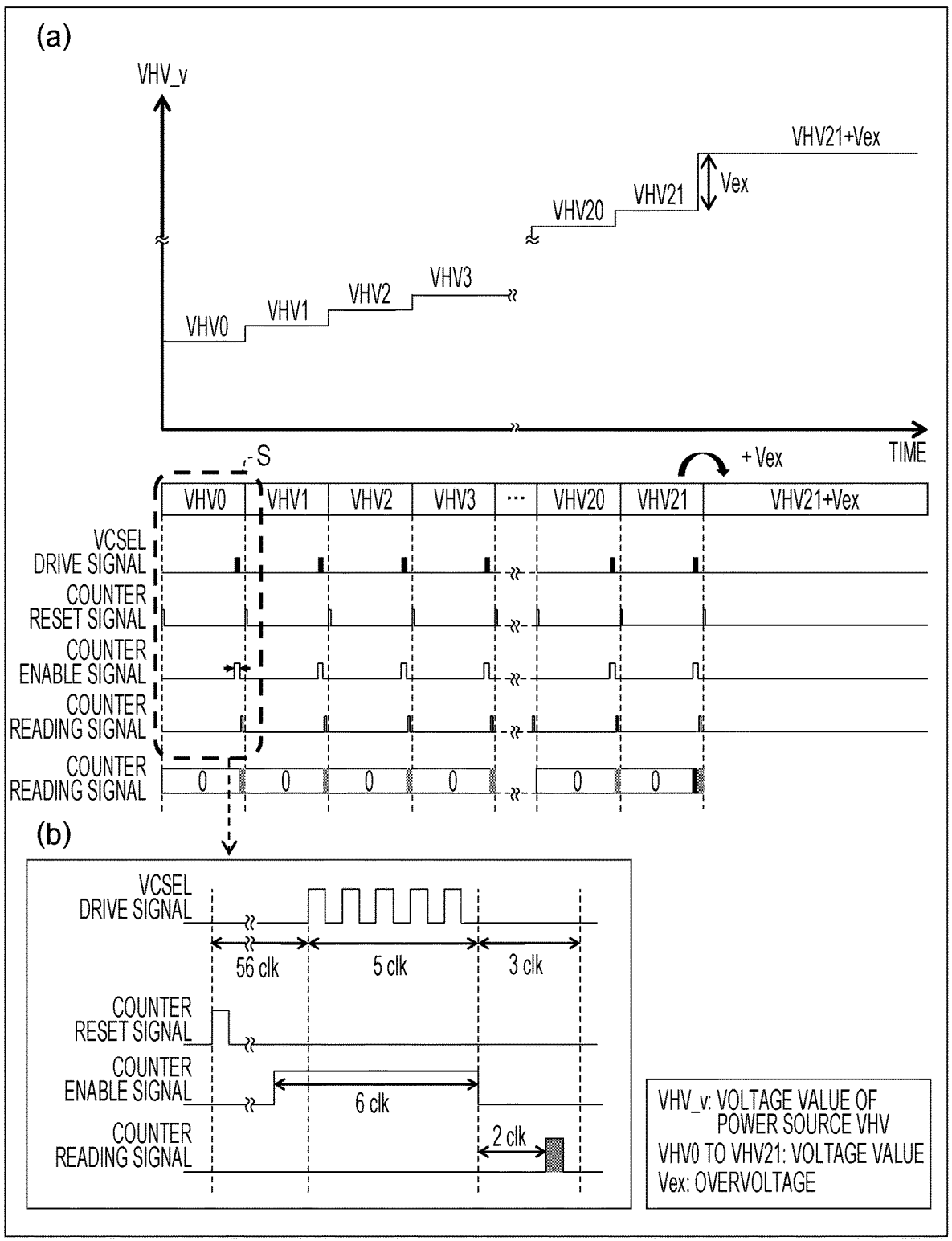
FIG. 6(a) is a graph indicating an output of a reverse bias voltage in SPAD arrays according to Embodiment 4 of the invention and a sequence diagram illustrating an operation of a SPAD bias control block.
FIG. 6(b) is an enlarged view of a part of S in FIG. 6(a).
Figure 7:
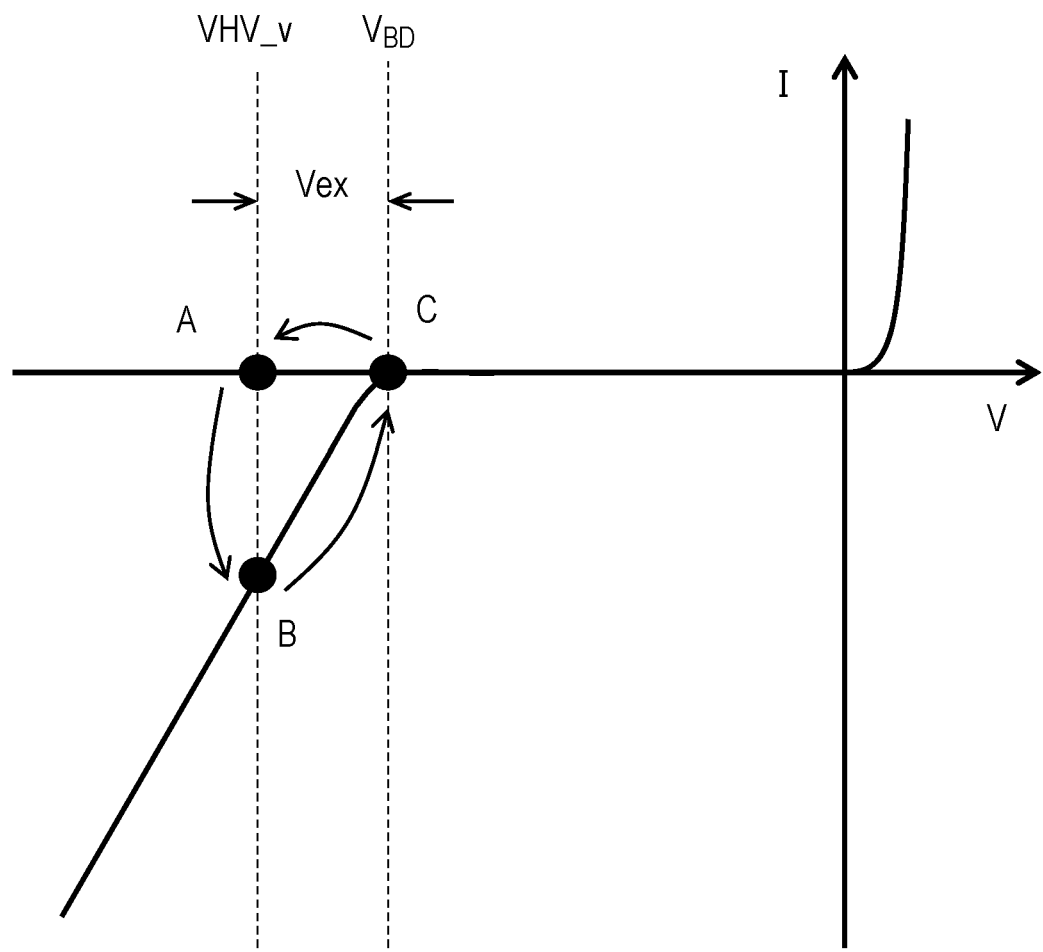
FIG. 7 is a graph indicating an operation state in a Geiger mode in a conventional avalanche photodiode.

Another embodiment of the invention will be described as follows with reference to FIGS. 1 and 6. Note that, for convenience of description, the same reference signs will be assigned to members having the same functions as those of the members described in the above-described embodiments, and description thereof will be omitted.

As described above in Embodiment 1, the SPAD bias control block 20 in the present embodiment includes the VCSEL driver control unit 21, the pulse counter 22, the determination unit 23, and the HV control unit 24 as illustrated in FIG. 1.

Description below has been given in Embodiment 1, but is given here again.

The pulse counter 22 counts the pulse signal output from the SPAD array 8, when the reverse bias voltage to be applied to the SPAD array 8 and the SPAD array 9 is set.

The determination unit 23 determines a pulse number which is output by the pulse counter 22.

The VCSEL driver control unit 21 controls the HV control unit 24, which controls the HV generation circuit 12, and the VCSEL driver 2 in accordance with a determination result by the determination unit 23. Thereby, the VCSEL driver control unit 21 is able to control the VCSEL 3 and the HV generation circuit 12 in accordance with the determination result by the determination unit 23.

A sequence operation of setting the voltage VHV_v of the power source VHV in the VHV voltage setting period 40B will be described by using FIG. 6. FIG. 6(a) is a graph indicating an output of a reverse bias voltage in the SPAD array 8 and the SPAD array 9 according to Embodiment 4 of the invention and a sequence diagram illustrating an operation of the SPAD bias control block. 20. FIG. 6(b) is an enlarged view of a part of S in FIG. 6(a).

As illustrated in FIG. 6(a), the SPAD bias control block 20 raises the reverse bias voltage (voltage VHV_v of the power source VHV) to be applied to the SPAD array 8 and the SPAD array 9 from a low voltage to a high voltage. The voltage VHV_v of the power source VHV starts from an initial value VHV0. A counter reset signal is input to the pulse counter 22 immediately after the reverse bias voltage VHV0 is applied to the SPAD array 8 and the SPAD array 9. Thereby, the SPAD bias control block 20 resets the pulse counter 22 so that the pulse counter 22 reaches 0 count. Thereafter, the VCSEL driver control unit 21 controls a VCSEL drive signal to perform pulse emission five times. That is, the VCSEL driver 2 causes the VCSEL 3 to perform pulse emission five times. A pulse number of the VCSEL 3 is five here, but may be another pulse number.

Here, as illustrated in FIG. 6(b), the SPAD bias control block 20 enables a counter enable signal of the pulse counter 22 during a period when the VCSEL 3 performs pulse emission. That is, the SPAD bias control block 20 adjusts a reverse bias voltage during the period when the VCSEL 3 emits light. Then, the SPAD bias control block 20 counts, by the pulse counter 22, a pulse signal output from the SPAD array 8. At this time, a timing when the counter enable signal is enabled is a timing before the VCSEL 3 starts pulse emission. It is thereby possible to prevent the pulse counter 22 from missing count of the pulse signal.

Thereafter, the pulse counter 22 sets a counter reading signal to be at a High level and transmits the count number to the determination unit 23. Here, when the determination unit 23 determines that the count number of the pulse signal output from the SPAD array 8 is smaller than the pulse number that the VCSEL 3 is caused to emit light, the HV control unit 24 raises the voltage VHV_v of the power source VHV from VHV0 to VHV1. Thereafter, a similar operation is performed.

At this time, a step at which the HV control unit 24 raises the voltage VHV_v of the power source VHV may be performed with an equal voltage or may not be performed with an equal voltage.

Here, for example, a case where an output of the pulse counter 22 is five or more when the voltage VHV_v of the power source VHV reaches VHV21 will be described. In this case, the SPAD bias control block 20 judges that VHV21 is a breakdown voltage $V_{BD}$ of the SPAD. At this time, the SPAD bias control block 20 controls the HV generation circuit 12 so as to generate a voltage higher than the breakdown voltage $V_{BD}$ by an amount of an overvoltage Vex in order to operate the SPADs of the SPAD array 8 and the SPAD array 9 in the Geiger mode. In the distance measurement period 41, the HV control unit 24 sets the reverse bias voltage to be applied to the SPAD array 8 and the SPAD array 9 to be VHV21+ Vex. In this case, Vex may depend on temperature. Moreover, before the distance measurement period 41, the HV control unit 24 controls the reverse bias voltage to be applied to the SPAD array 8 and the SPAD array 9 as described above.

Accordingly, the SPAD bias control block 20 adjusts the reverse bias voltage in accordance with the pulse number of the pulse signal that is output by the SPAD array 8 correspondingly to light incident on the SPAD array 8. As a result, even when temperature changes or the breakdown voltage $V_{BD}$ of the SPAD varies depending on a process condition, the light detection device 1 is able to cause the SPAD array 8 and the SPAD array 9 to stably operate in the optimum Geiger mode. In addition, a current detection circuit is not used in the light detection device 1, so that it is possible to reduce a circuit scale. Furthermore, the light detection device 1 specifies the breakdown voltage $V_{BD}$, and is thus able to cause the SPAD to operate in the optimum Geiger mode at all times without causing the SPAD to store the breakdown voltage in advance.

Moreover, the light detection device 1 may be provided in an electronic apparatus. An example of the electronic apparatus includes a portable information terminal such as a smartphone. By including the light detection device 1, the electronic apparatus is able to achieve size reduction and to have a function of measuring a distance between the electronic apparatus and the detection target 6.

Conclusion

A light detection device 1 according to an aspect 1 of the invention includes: a first SPAD array (SPAD array 8) on which first light 4, 5 that is a light pulse emitted from a light emitting unit (VCSEL 3) is incident and which operates in a Geiger mode; a second SPAD array (SPAD array 9) on which second light 7 that is obtained when the first light 4, 5 is reflected by a detection target 6 is incident and which operates in the Geiger mode; a voltage generation unit (HV generation circuit 12) that applies a reverse bias voltage to the first SPAD array (SPAD array 8) and the second SPAD array (SPAD array 9); and a voltage adjustment unit (SPAD bias control block 20) that adjusts the reverse bias voltage in accordance with a pulse number of a pulse signal output by the first SPAD array (SPAD array 8) upon incidence of the first light 4, 5.

With the aforementioned configuration, it is possible to provide a light detection device that is able to cause a SPAD to operate in an optimum Geiger mode at all times, even when temperature changes or a breakdown voltage varies. In addition, it is possible to reduce a circuit scale and to cause the SPAD to operate in the optimum Geiger mode at all times without causing the SPAD to store the breakdown voltage in advance.

Accordingly, with the aforementioned configuration, it is possible to reduce the circuit scale and achieve reduction of manufacturing costs, which accompanies reduction in a man-hour for manufacturing.

In the light detection device 1 according to an aspect 2 of the invention, in the aspect 1, the voltage adjustment unit (SPAD bias control block 20) may adjust the reverse bias voltage during a period in which the light emitting unit (VCSEL 3) emits the first light 4, 5.

With the aforementioned configuration, by limiting determination of presence or absence of the pulse signal output from the first SPAD array (SPAD array 8) only to a period in which the light emitting unit (VCSEL 3) emits light, it is possible to cause a constant amount of light to be incident on the SPAD array (SPAD array 8) at all times. Thereby, the light detection device 1 is hardly affected by dark count, and is able to perform more accurate control with a reverse bias voltage.

In the light detection device 1 according to an aspect 3 of the invention, in the aspect 1 or 2, emission intensity of light emitted by the light emitting unit (VCSEL 3) when the reverse bias voltage is adjusted may be weaker than emission intensity of light emitted by the light emitting unit (VCSEL 3) when a distance between the light detection device 1 and the detection target 6 is measured.

With the aforementioned configuration, it is possible to easily suppress power consumption of the light detection device 1.

In the light detection device 1 according to an aspect 4 of the invention, in any of the aspects 1 to, an active-quenching circuit may be connected to the first SPAD array (SPAD array 8) and the second SPAD array (SPAD array 9), and a resistance value of the active-quenching circuit may be adjusted before the voltage adjustment unit (SPAD bias control block 20) adjusts the reverse bias voltage.

With the aforementioned configuration, by adjusting the reverse bias voltage to be applied to SPADs of the first SPAD array (SPAD array 8) and the second SPAD array (SPAD array 9) after the resistance value of quenching resistor of the active-quenching circuit is decided, it is possible to perform more accurate control with the reverse bias voltage.

In the light detection device 1 according to an aspect 5 of the invention, in the aspect 4, the adjustment of the resistance value of the active-quenching circuit and the adjustment of the reverse bias voltage may be performed before the measurement of the distance to the detection target 6.

With the aforementioned configuration, when the distance between the light detection device 1 and the detection target 6 is measured, it is possible to perform more accurate control with the reverse bias voltage.

An electronic apparatus according to an aspect 6 of the invention may include the light detection device 1 in any of the aspects 1 to 5.

With the aforementioned configuration, by including the light detection device 1, the electronic apparatus is able to achieve size reduction and to have a function of measuring a distance between the electronic apparatus and the detection target 6.

The invention is not limited to each of the embodiments described above, and may be modified in various manners within the scope of the claims and an embodiment achieved by appropriately combining technical means disclosed in each of different embodiments is also encompassed in the technical scope of the invention. Further, by combining the technical means disclosed in each of the embodiments, a new technical feature may be formed.

REFERENCE SIGNS LIST 1, 1' light detection device
2 VCSEL driver
3 VCSEL (light emitting unit)
4, 5 first light
6 detection target
7 second light
8, 9 SPAD array (first SPAD array, second SPAD array)
10, 11 SPAD front-end circuit
12 HV generation circuit (voltage generation unit)
13 DLL
14 time difference measurement counter
15 data register
20 SPAD bias control block (voltage adjustment unit)
21 VCSEL driver control unit
22 pulse counter
23 determination unit
24 HV control unit
30, 31 optical filter
32 light-shielding wall
33 mirror
40 pre-measurement setting period
40A quenching resistance value setting period
40B VHV voltage setting period
41, 42 distance measurement period
SPAD1, SPAD2, SPADn SPAD
CTL1, CTL2, CTLn, CTL_AQM, AQM_OUT, SPAD_OUT terminal
M1, M2, Mn, Maqm NMS transistor
VHV, VS1 power source
IQ current source
VHV_v voltage of power source VHV
VS1_v voltage of power source VS1
AQM_OUT_v voltage of terminal AQM_OUT
VS10 to VS19, VS1A to VS1F, VHV0 to VHV21, High voltage value
Vex overvoltage
$V_{BD}$ breakdown voltage

The invention claimed is:
1. A light detection device comprising:
a first SPAD array on which first light that is a light pulse emitted from a light emitting unit is incident and which operates in a Geiger mode;

a second SPAD array on which second light that is obtained when the first light is reflected by a detection target is incident and which operates in the Geiger mode;

a voltage generation unit that applies a reverse bias voltage to the first SPAD array and the second SPAD array; and a voltage adjustment unit that adjusts the reverse bias voltage in accordance with a pulse number of a pulse signal output by the first SPAD array upon incidence of the first light.

2. The light detection device according to claim 1, wherein the voltage adjustment unit adjusts the reverse bias voltage during a period in which the light emitting unit emits the first light.

3. The light detection device according to claim 1, wherein emission intensity of light emitted by the light emitting unit when the reverse bias voltage is adjusted is weaker than emission intensity of light emitted by the light emitting unit when a distance between the light detection device and the detection target is measured.

4. The light detection device according to claim 1, wherein an active-quenching circuit is connected to the first SPAD array and the second SPAD array, and a resistance value of the active-quenching circuit is adjusted before the voltage adjustment unit adjusts the reverse bias voltage.

5. The light detection device according to claim 4, wherein the adjustment of the resistance value of the active-quenching circuit and the adjustment of the reverse bias voltage by the voltage adjustment unit are performed before the measurement of the distance to the detection target.

6. An electronic apparatus comprising the light detection device according to claim 1.

* * * * *